United States Patent
Kim et al.

(10) Patent No.: US 8,633,586 B2
(45) Date of Patent: Jan. 21, 2014

(54) MOCK BUMP SYSTEM FOR FLIP CHIP INTEGRATED CIRCUITS

(75) Inventors: Oh Han Kim, Icheon (KR); BaeYong Kim, Seoul (KR); YoungMin Kim, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 202 days.

(21) Appl. No.: 12/184,219

(22) Filed: Jul. 31, 2008

(65) Prior Publication Data

US 2009/0243091 A1 Oct. 1, 2009

Related U.S. Application Data

(63) Continuation-in-part of application No. 12/055,665, filed on Mar. 26, 2008.

(51) Int. Cl.
*H01L 23/485* (2006.01)

(52) U.S. Cl.
USPC ............ 257/737; 257/E23.021; 257/E21.511; 257/E21.508; 438/613

(58) Field of Classification Search
USPC ........... 257/737, E23.021, E21.511, E21.508; 438/613
See application file for complete search history.

(56) References Cited

U.S. PATENT DOCUMENTS

| | | | |
|---|---|---|---|
| 5,220,200 A * | 6/1993 | Blanton | 257/778 |
| 5,764,486 A | 6/1998 | Pendse | |
| 6,251,797 B1 * | 6/2001 | Nishimura | 438/745 |
| 6,483,190 B1 | 11/2002 | Kainuma et al. | |
| 6,919,642 B2 | 7/2005 | Hsieh et al. | |
| 7,052,935 B2 | 5/2006 | Pai et al. | |
| 7,148,560 B2 | 12/2006 | Lee et al. | |
| 7,294,927 B2 | 11/2007 | Takahashi | |
| 7,314,811 B2 | 1/2008 | Tan et al. | |
| 7,425,468 B2 | 9/2008 | Wang et al. | |
| 2002/0060084 A1 * | 5/2002 | Hilton et al. | 174/52.1 |
| 2003/0057552 A1 * | 3/2003 | Kainuma et al. | 257/737 |
| 2004/0149489 A1 * | 8/2004 | Ferrando et al. | 174/261 |
| 2004/0166660 A1 | 8/2004 | Yamaguchi | |
| 2005/0104222 A1 | 5/2005 | Jeong et al. | |
| 2005/0212114 A1 * | 9/2005 | Kawano et al. | 257/690 |
| 2006/0097377 A1 | 5/2006 | Youn | |
| 2006/0163749 A1 * | 7/2006 | Lee et al. | 257/778 |
| 2007/0152350 A1 * | 7/2007 | Kim et al. | 257/786 |
| 2007/0200229 A1 | 8/2007 | Daubenspeck et al. | |
| 2008/0042256 A1 * | 2/2008 | Hsieh | 257/698 |
| 2009/0020869 A1 * | 1/2009 | Xue et al. | 257/737 |

\* cited by examiner

*Primary Examiner* — Marc Armand
(74) *Attorney, Agent, or Firm* — Ishimaru & Associates LLP

(57) ABSTRACT

A mock bump system includes: providing a first structure having an edge; and forming a mock bump near the edge.

20 Claims, 6 Drawing Sheets

MOCK BUMP SYSTEM FOR FLIP CHIP INTEGRATED CIRCUITS

This is a continuation-in-part of co-pending U.S. patent application Ser. No. 12/055,665 filed Mar. 26, 2008.

TECHNICAL FIELD

The present invention relates generally to a system for integrated circuit packages, and more particularly to a system for limiting the impact of delamination in flip chip packages.

BACKGROUND ART

Many of today's most common consumer products, such as hand held computers, personal digital assistants, cellular telephones, and digital cameras, rely on flip chip technology to meet the demands of function versus space. Many of these devices have to perform flawlessly in adverse environmental conditions. A primary enemy of flip chip technology is heat. A flip chip integrated circuit may be held in place by hundreds of solder interconnects that provide an electrical and thermal interface to the system in which it is installed.

Problems can occur in flip chip devices if the coefficient of thermal expansion (CTE) of the surrounding package or board doesn't exactly match the CTE of the flip chip device and the solder interconnects. The corners and edges of the flip chip may move slightly due to the heat. This slight movement may cause extremely large pressures on the solder interconnects and in some cases may cause cracks that can cause failure of the flip chip integrated circuit. The occurrence of these cracks is called delamination.

The delamination typically occurs in the thin outer layers of the integrated circuit that form the foundation for the solder interconnects. The delamination may cause cracks that increase the probability that the integrated circuit will fail. It exposes the design to conditions far beyond the original design goals. This excursion into uncharted performance areas may cause the integrated circuit to operate but misinterpret data or transfer erroneous information.

Many strategies have been developed in order to live with delamination. The outermost interconnects in an array may be reserved for ground connections while the inner most interconnects may be the data to operate the function. This allows giving up some interconnects as a sacrificial barrier. This type of strategy may extend the useable life of an integrated circuit, but cannot prevent the eventual demise of the flip chip integrated circuit. While giving a sense of good design, this strategy leaves the reliability of the flip chip integrated circuit at the mercy of heat and the delamination process.

Thus, a need still remains for a means to resist the cause of delamination and extend the reliability of the flip chip integrated circuit. In view of the growing demand for integrated circuit devices packed full of our favorite functions in smaller and smaller spaces, it is increasingly critical that answers be found to these problems. In view of the ever-increasing commercial competitive pressures, along with growing consumer expectations, and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a mock bump system including: providing a first structure having an edge; and forming a mock bump near the edge.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
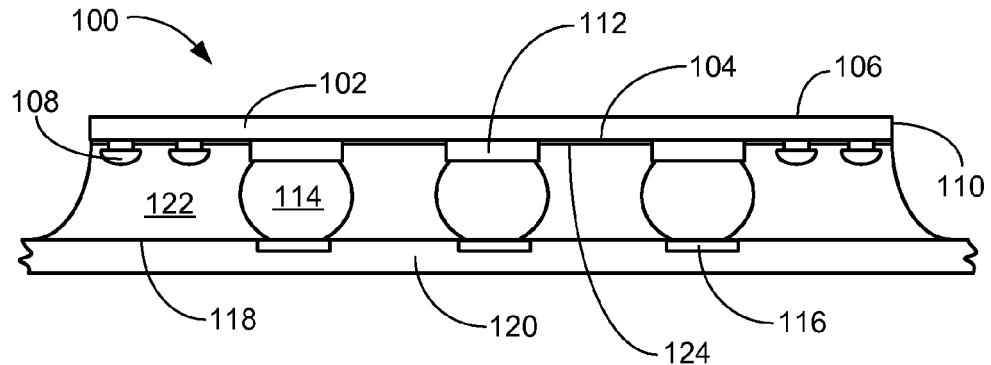
FIG. 1 is a cross-sectional view of a mock bump system for flip chip integrated circuits, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the flip chip integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a cross-sectional view of a mock bump system 100 for flip chip integrated circuits, in an embodiment of the present invention. The cross-sectional view of the mock bump system 100 depicts a flip chip integrated circuit 102 having an active surface 104 and a back side 106. A mock bump 108, such as a mushroom shaped bump, may be formed on the active surface 104 near an edge 110. An under bump metallization 112, such as successive layers of metal, may be distributed across the active surface 104. A chip interconnect 114, such as a solder ball, solder bump, solder column, or stud bump, may be formed on each of the under bump metallization 112.

The chip interconnect 114 may be coupled to a contact pad 116 on a component side 118 of a substrate 120. An underfill material 122, such as a low stress liquid epoxy, may be injected between the flip chip integrated circuit 102 and the substrate 120. The underfill may completely encase the mock bump 108, the under bump metallization 112 and the chip interconnect 114.

The active surface 104 of the flip chip integrated circuit 102 may be coated with a passivation layer 124, such as a silicon oxide (SiO) layer or a silicon nitride (SiN) layer. The underfill material 122 may have a weak adhesion with the passivation layer 124. In order to better support the interface between the underfill material 122 and the flip chip integrated circuit 102, the mock bumps 108 will have a strong adhesion to the underfill material 122.

The inverted mushroom shape of the mock bump 108 presents a strong adhesion by providing a flat surface beneath the surface of the underfill. By placing the mock bumps 108 along the edge 110 of the flip chip integrated circuit 102, the edge 110 and the corners (not shown) may be prevented from rising away from the underfill material 122. This reduction in the flexure of the flip chip integrated circuit 102 may prevent the delamination of the under bump metallization 112 from the flip chip integrated circuit 102.

The number and position of the mock bumps 108 is an example only and the actual number and position may differ. Likewise the number and position of the under bump metallization 112 and the chip interconnect 114 is an example only and the actual number and position may differ.

Figure 2:
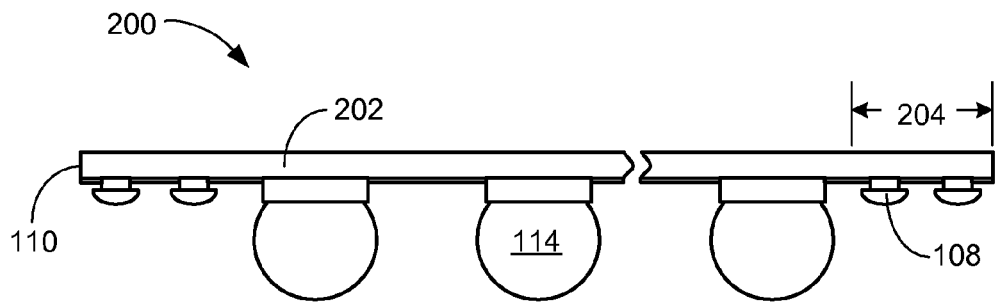
FIG. 2 is a cross-sectional view of a flip chip integrated circuit having the mock bump system.

Referring now to FIG. 2, therein is shown a cross-sectional view of a flip chip integrated circuit 200 having the mock bump system 100. The cross-sectional view of the flip chip integrated circuit 200 depicts a flip chip integrated circuit 202 having a barrier region 204 adjacent to the edge 110. The mock bump 108 may be positioned on the barrier region 204.

Since the barrier region is present in all of the flip chip integrated circuit 202 there is no difference in the size of the flip chip integrated circuit 202 when the mock bumps 108 are included in the design.

The addition of the mock bumps 108 may provide significant leverage on the edge 110 of the flip chip integrated circuit 202. When the underfill material 122, of FIG. 1, is applied over the mock bumps 108, it provides an anchor-like attachment to the edge 110 of the flip chip integrated circuit 202. There may be no electrical connection between the mock bump 108 and any of the chip interconnects 114.

Figure 3:
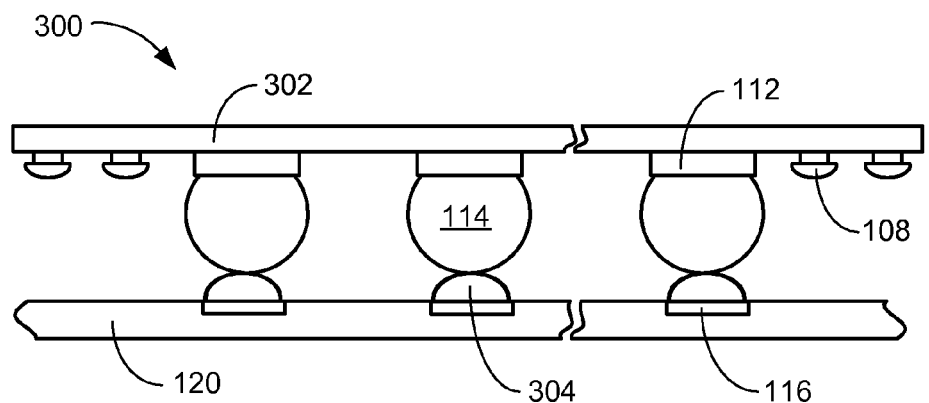
FIG. 3 is a cross-sectional view of a flip chip integrated circuit assembly in a substrate attach phase of manufacturing.

Referring now to FIG. 3, therein is shown a cross-sectional view of a flip chip integrated circuit assembly 300 in a substrate attach phase of manufacturing. The cross-sectional view of the flip chip integrated circuit assembly 300 depicts a flip chip integrated circuit 302 having the mock bump 108, the under bump metallization 112, and the chip interconnect 114. The substrate 120 may have the contact pad 116 with an adhesive 304, such as a solder paste, deposited thereon.

Figure 4:
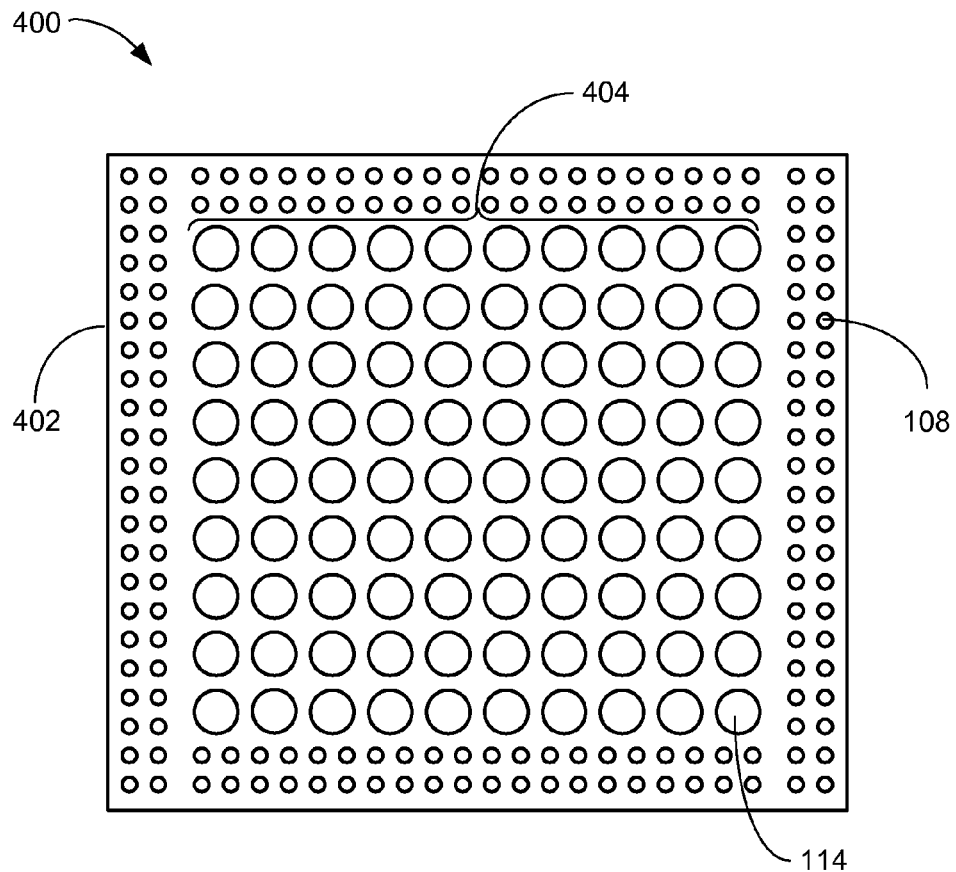
FIG. 4 is an active side view of a flip chip integrated circuit having the mock bump system.

Referring now to FIG. 4, therein is shown an active side view of a flip chip integrated circuit 400 having the mock bump system. The active side view of the flip chip integrated circuit 400 depicts a semiconductor die 402 having an array 404 of the chip interconnect 114 dispersed over the interior portion of the semiconductor die 402. The mock bumps 108 may be formed in a double row around the array 404. The mock bumps 108 reside in a space that may have no electrical connections. The outer region of the semiconductor die 402 may usually be reserved for a barrier (not shown), built on the interior metal layers, that prevents cracks from reaching the embedded logic (not shown) during the singulation process. The addition of the mock bumps 108 does not add any additional area to the semiconductor die 402.

The mock bump 108 may have a maximum diameter of 10 μm. This size is in comparison to the chip interconnects 114 that may have a diameter in the range of 50 μm to 500 μm.

The number and position of the mock bumps 108 is an example only, and a double row of the mock bumps 108 is for simplification. The mock bumps 108 may be in any position or arrangement near the edge 110, of FIG. 1, of the semiconductor die 402.

Figure 5:
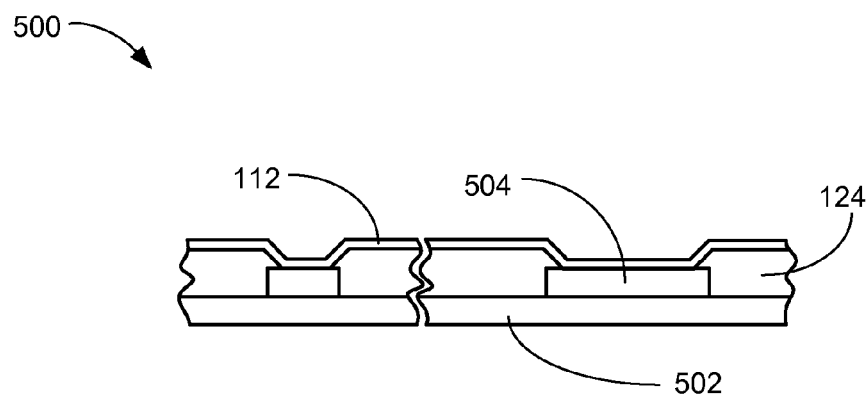
FIG. 5 is a cross-sectional view of a segment of a flip chip integrated circuit in a contact plating phase of manufacture.

Referring now to FIG. 5, therein is shown a cross-sectional view of a segment of a flip chip integrated circuit 500 in a contact plating phase of manufacture. The cross-sectional view of a segment of the flip chip integrated circuit 500 depicts a semiconductor wafer 502, such as a silicon wafer, having a bond pad 504. The bond pad 504 may include an aluminum bond pad, a copper bond pad, a nickel bond pad, or a combination thereof.

The passivation layer 124 may be deposited on the semiconductor wafer 502 and the bond pad 504, while leaving the top of the bond pad 504 exposed. The under bump metallization 112 may consist of several layers of metal each lending a specific characteristic to the stack. For simplicity the layers are not shown in detail. The under bump metallization 112 may be shown as a single layer for the purpose of this explanation and in further figures. The under bump metallization 112 may be limited to the region around a specific unit of the bond pad 504, or it may extend between several of the bond pads 504 depending on the internal connections of the embedded logic (not shown).

Figure 6:
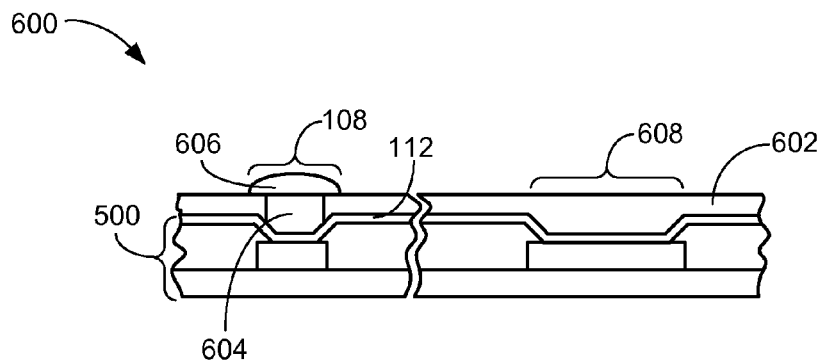
FIG. 6 is a cross-sectional view of a segment of a flip chip integrated circuit in a first metal plating phase of manufacture.

Referring now to FIG. 6, therein is shown a cross-sectional view of a segment of a flip chip integrated circuit 600 in a first metal plating phase of manufacture. The cross-sectional view of the segment of the flip chip integrated circuit 600 depicts the flip chip integrated circuit 500 having a first photo resist layer 602 formed thereon. The processing of the first photo resist layer 602 provides an opening over the under bump metallization 112 for the mock bump 108. The first photo resist layer 602 may be a temporary layer used in the manufacturing process to set the dimensions of a layer or structure.

The mock bump 108 may be formed by a deposition of a metal having a high reflow temperature, such as copper (Cu) or nickel (Ni). The high reflow temperature assures that the mock bump 108 will not change shape during the reflow process of the chip interconnect 114, of FIG. 1, which has a much lower reflow temperature.

The mock bump 108 may include two unique but contiguous sections. A bump body 604, which may be in the shape of a cylinder, a rectangular solid, or some other geometric shape, and a bump cap 606. The bump body 604 is attached to the flip chip integrated circuit 500. The bump cap 606 may be in the shape of a hemisphere or it may have an oval vertical portion. The bump cap 606 further has a wider diameter than the bump body 604. This provides a flat surface beneath the bump cap 606 that may add to the adhesion with the underfill material 122, of FIG. 1. The flat surface beneath the bump cap 606 is separated from the flip chip integrated circuit 500 by a gap.

The bump body 604 and the bump cap 606 may be deposited through the opening in the first photo resist layer 602 by electroplating to form a structural connection with the under bump metallization 112. The shape of the mock bump 108 will not change after this deposition step. A bump seat 608 may be completely protected from any copper of nickel contamination by the first photo resist layer 602. The bump seat 608 may be exposed in a later manufacturing step.

Figure 7:
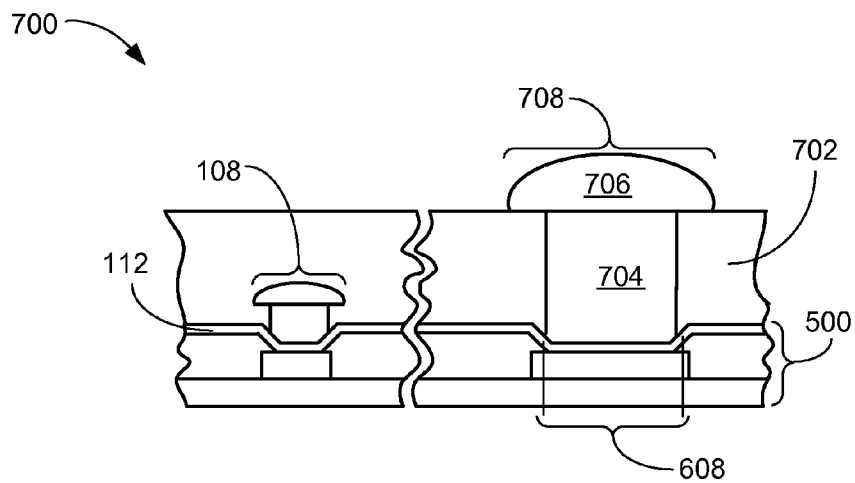
FIG. 7 is a cross-sectional view of a segment of a flip chip integrated circuit in a second metal plating phase of manufacture.

Referring now to FIG. 7, therein is shown a cross-sectional view of a segment of a flip chip integrated circuit 700 in a second metal plating phase of manufacture. The cross-sectional view of the segment of the flip chip integrated circuit 700 depicts a second photo resist layer 702 over the flip chip integrated circuit 500. The second photo resist layer 702 differs from the first photo resist layer 602, of FIG. 6, only by its thickness. The first photo resist layer 602 must be completely removed by a previous process step in order to expose the bump seat 608.

An opening may be formed in the second photo resist layer 702 over the bump seat 608 for exposing the under bump metallization 112. An interconnect body 704 may be formed in the opening by electroplating a solder, such as Lead (Pb), Tin (Sn), Bismuth (Bi), Indium (In), or an alloy thereof. An interconnect cap 706 may be continuously formed by the continued deposition of the solder above the top of the second photo resist layer 702. The deposition of the solder forms a raw interconnect 708 in the shape of a mushroom, similar to the shape of the mock bump 108, though this shape is only temporary. After the deposition of the solder, the second photo resist layer 702 is completely removed in preparation of the next manufacturing step.

Figure 8:
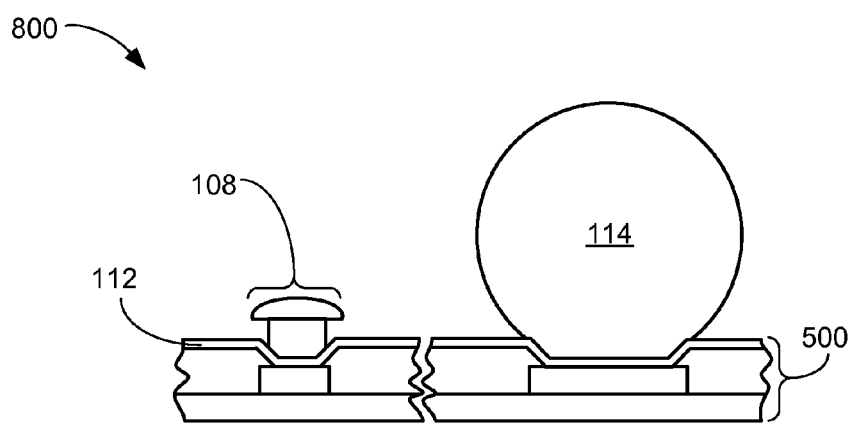
FIG. 8 is a cross-sectional view of a segment of a flip chip integrated circuit in a reflow phase of manufacture.

Referring now to FIG. 8, therein is shown a cross-sectional view of a segment of a flip chip integrated circuit 800 in a reflow phase of manufacture. The cross-sectional view of the segment of the flip chip integrated circuit 800 depicts the flip chip integrated circuit 500 having the mock bump 108 coupled to the under bump metallization 112. The chip interconnect 114 may have been by reflowing the raw interconnect 708, of FIG. 7. During the reflow process, the temperature is maintained below the temperature necessary to reflow the mock bump 108.

While the description of the manufacturing process of the mock bump 108 and the chip interconnect 114 is an example it may not be the only way to produce the current invention. Other processes may include attaching a pre-formed unit of the mock bump 108 or the chip interconnect 114. Thus the invention is not limited by its manufacturing technique.

It has been unexpectedly discovered that the mushroom shape of the mock bump 108 supplies a significant improvement in the reliability of the flip chip attachment over and above other shapes that were tested. The combination of the flat surface embedded in the underfill material 122, of FIG. 1, and the adhesion of the rounded section of the bump cap 606, of FIG. 6, may prevent or severely restrict the delamination process.

Figure 9:
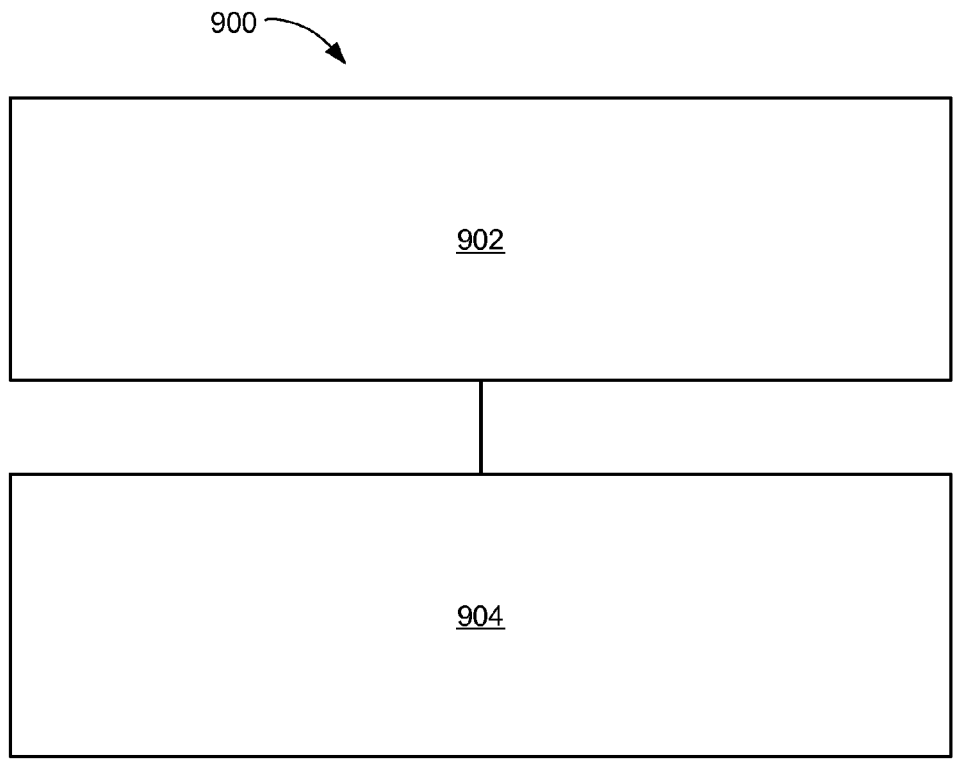
FIG. 9 is a flow chart of a mock bump system for manufacturing the mock bump system for flip chip attach in accordance with an embodiment of the present invention.

Referring now to FIG. 9, therein is shown a flow chart of a mock bump system 900 for manufacturing the mock bump system 100 for flip chip attach in accordance with an embodiment of the present invention. The system 900 includes providing a flip chip integrated circuit having an edge in a block 902 and forming a mock bump near the edge in a block 904.

Figure 10:
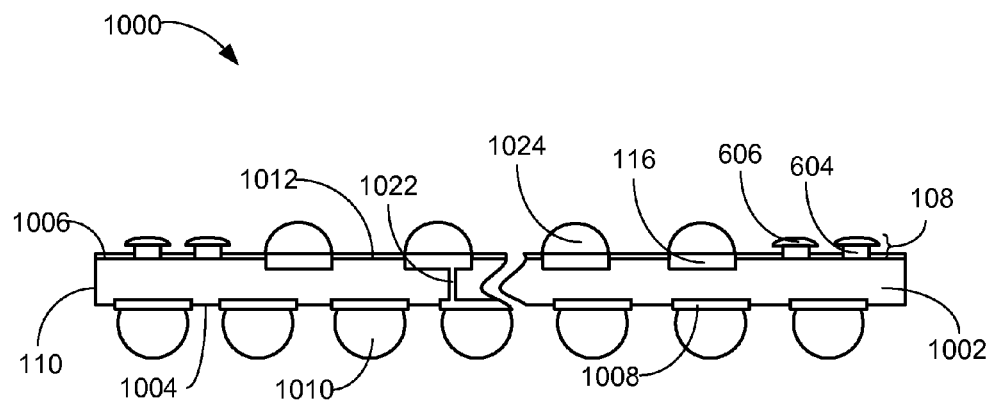
FIG. 10 is a cross-sectional view of a mock bump system for flip chip integrated circuits, in an embodiment of the present invention.

Referring now to FIG. 10, therein is shown a cross-sectional view of a mock bump system 1000 for flip chip integrated circuits, in an embodiment of the present invention. The cross-sectional view of the mock bump system 1000 depicts a first structure 1002, such as a flip chip substrate, having an edge 110, a system side 1004, and a component side 1006. The system side 1004 may have system contacts 1008, such as contact pads, for coupling to the next level system (not shown). The system contacts 1008 may optionally have a system interconnect 1010, such as a solder ball, solder column, solder bump, or stud bump, for coupling the next level system or it may connect directly to the next level system with a conductive paste.

A solder resist layer 1012 may be applied to the component side 1006 of the first structure 1002. The solder resist layer 1012 may aid in the reflow process by preventing the liquid solder from flowing across the first structure 1002.

The mock bump 108 may be formed near the edge 110 and secured on the component side 1006 of the first structure 1002. The mock bump 108 may be formed of a conductive material, such as nickel (Ni) or copper (Cu), in a shape resembling a mushroom. The mock bump 108 may be coupled to metal layers (not shown) within the first structure 1002 for providing a stationary fixture. The mock bump 108 may have the bump body 604, such as a cylindrical shaped base, and the bump cap 606 of a larger width than the bump body 604. The bump cap 606 may have a dome shape that is concentric with the bump body 604 and may have a maximum width of 10 μm.

The description of the mock bump 108 is an example only and the actual implementation may differ. The bump body 604 may be in the shape of a rectangular solid or some other geometric solid. The bump cap 606, while having a larger width than the bump body 604, may have a different geometric shape.

The contact pad 116 may be formed on the component side 1006 of the first structure 1002. The contact pads 116 may be coupled to the system contact 1008 by a via 1022. The combination of the contact pad 116, the via 1022, and the system contact 1008 may provide an electrical connection between the system interconnect 1010 and a component bump 1024, such as a solder bump, that is optionally coupled to the contact pad 116.

The number and position of the system contacts 1008 relative to the contact pads 116 is an example only and the actual number and position may differ. While FIG. 1 shows the system interconnects 1010 and the component bumps 1024 coupled to the first structure 1002, both may be optional and any combination of the system interconnects 1010 and the component bumps 1024 may be used.

Figure 11:
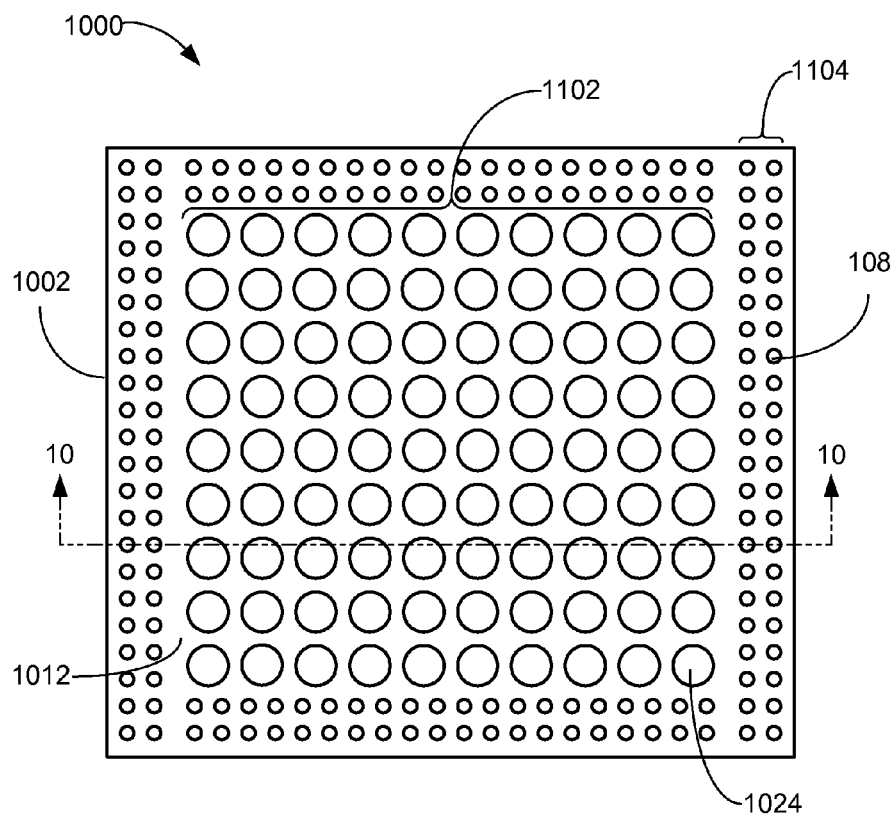
FIG. 11 is a top view of the mock bump system for flip chip integrated circuits, of FIG. 10, in an embodiment of the present invention.

Referring now to FIG. 11, therein is shown a top view of the mock bump system 1000 for flip chip integrated circuits, of FIG. 10, in an embodiment of the present invention. The top view of the mock bump system 1000 depicts the first structure 1002 having an array 1102 of the component bump 1024. Since the component bump 1024 is an optional addition, the array 1102 may be of the contact pad 116, of FIG. 10.

A column 1104 of the mock bump 108 may be formed on each of the four edges of the first structure 1002 and may surround the array 1102. At least a portion of the column 1104 is designed to fall within the perimeter of an integrated circuit (not shown) that might be mounted on the first structure 1002. The column 1104 is displayed as having two columns of the mock bumps 108, but this is for example only and a different number of the columns of the mock bumps 108 may be used.

The surface of the flip chip substrate may be covered by the solder resist layer 1012. The column 1104 of the mock bump 108 may be used to prevent delamination of the finished package (not shown).

A section line 10-10 depicts the position and direction of view of the cross-sectional view of FIG. 10. The array 1102 depicted in FIG. 11 is an example only and any number of the component bump 1024 or the contact pads 116, of FIG. 10, may be present. In the event that more than one flip chip integrated circuit (not shown) may be attached to a single version of the first structure 1002, the column 1104 may be used to surround each of the arrays 1102 for the individual units of the flip chip integrated circuits.

Figure 12:
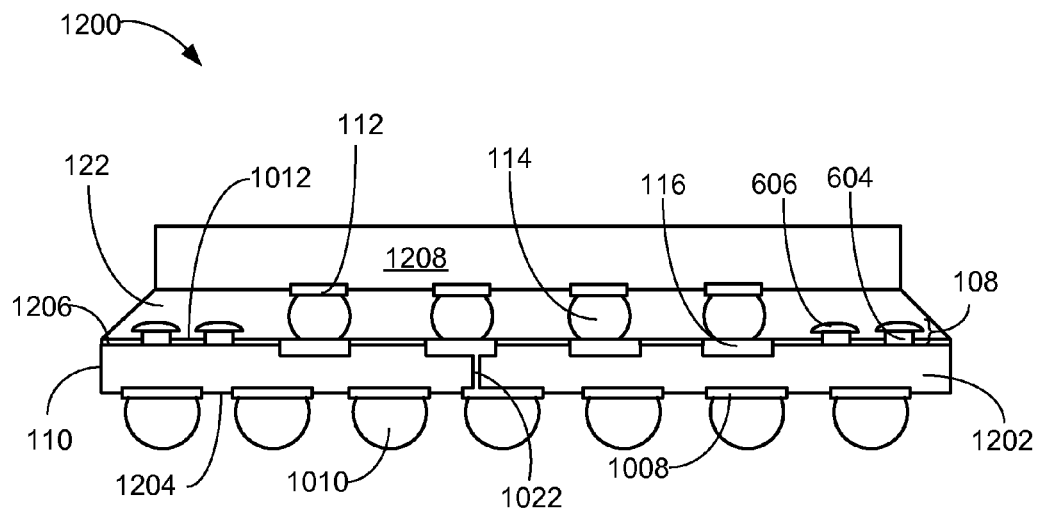
FIG. 12 is a cross-sectional view of a mock bump system for flip chip integrated circuits in an embodiment of the present invention.

Referring now to FIG. 12, therein is shown a cross-sectional view of a mock bump system 1200 for flip chip integrated circuits in an embodiment of the present invention. The cross-sectional view of the mock bump system 1200 depicts a first structure 1202 having an edge 110, a system side 1204, and a component side 1206. The system side 1204 may have the system contacts 1008, such as contact pads, for coupling to the next level system (not shown). The system contacts 1008 may optionally have the system interconnect 1010, such as a solder ball, solder column, solder bump, or stud bump, for coupling the next level system or it may connect directly to the next level system with a conductive paste.

The solder resist layer 1012 may be applied to the component side 1206 of the first structure 1202. The solder resist layer 1012 may aid in the reflow process by preventing the liquid solder from flowing across the first structure 1202.

The mock bump 108 may be formed near the edge 110 on the component side 1206 of the first structure 1202. The mock bump 108 may be formed of a conductive material, such as nickel (Ni) or copper (Cu), in a shape resembling a mushroom. The mock bump 108 may be coupled to metal layers (not shown) within the first structure 1202 for providing a stationary fixture. The mock bump 108 may have the bump body 604 and the bump cap 606 of a larger width than the bump body 604. The bump cap 606 may have a dome shape that is concentric with the bump body 604 and may have a maximum width of 10 μm.

The contact pad 116 may be formed on the component side 1206 of the first structure 1202. The contact pad 116 may be coupled to the system contact 1008 by the via 1022. A flip chip integrated circuit 1208, such as a flip chip integrated circuit may be mounted over the first structure 1202. The flip chip integrated circuit 1208, having the under bump metallization 112 may be coupled to the contact pads 116 by the chip interconnects 114, such as solder balls, solder columns, solder bumps, or stud bumps. The underfill material 122 may be injected between the first structure 1202 and the flip chip integrated circuit 1208. The underfill material 122 may be injected on the under bump metallization 112, the chip interconnect 114, the mock bumps 108, the solder resist layer 1012, and the contact pads 116. The mock bump 108 is attached only to the first structure 1202 with the bump body 604 in contact with the solder resist layer 1012 and the bump cap 606 spaced above the solder resist layer 1012 forming a gap. The mock bump 108 is surrounded by the underfill material 122, which fills the gap between the bump cap 606 and the solder resist layer 1012. The chip interconnect 114 can extend further from the first structure 1202 than the mock bump 108.

During the assembly process and during operation of the flip chip integrated circuit 1208, thermal stresses may cause the underfill material 122 to separate from the solder resist layer 1012. The structure of the mock bumps 108 may provide sufficient holding strength to prevent the delamination of the flip chip integrated circuit 1208 from the first structure 1202. The chip interconnects 114 are protected by the underfill material 122. By maintaining the integrity of the underfill material 122 between the flip chip integrated circuit 1208 and the first structure 1202, the operational reliability of the flip chip integrated circuit 1208 may be enhanced.

The combination of the under bump metallization 112, the chip interconnect 114, the contact pad 116, the via 1022, and the system contact 1008 may provide an electrical connection between the system interconnect 1010 and the flip chip integrated circuit 1208.

The combination shown in FIG. 12 is an example only. The actual unit of the flip chip integrated circuit 1208 may have a different number of the under bump metallization 112, there may be a different number of the mock bumps 108, and there may be a different number of the system interconnects 1010 on the first structure 1202. It has been discovered that the mushroom shape of the mock bumps 108 may prevent delamination of the flip chip integrated circuit 1208. While other shapes are possible, having the bump cap 606 and the bump body 604 form the mushroom shape provided superior resistance to delamination as compared to other shapes tested.

Figure 13:
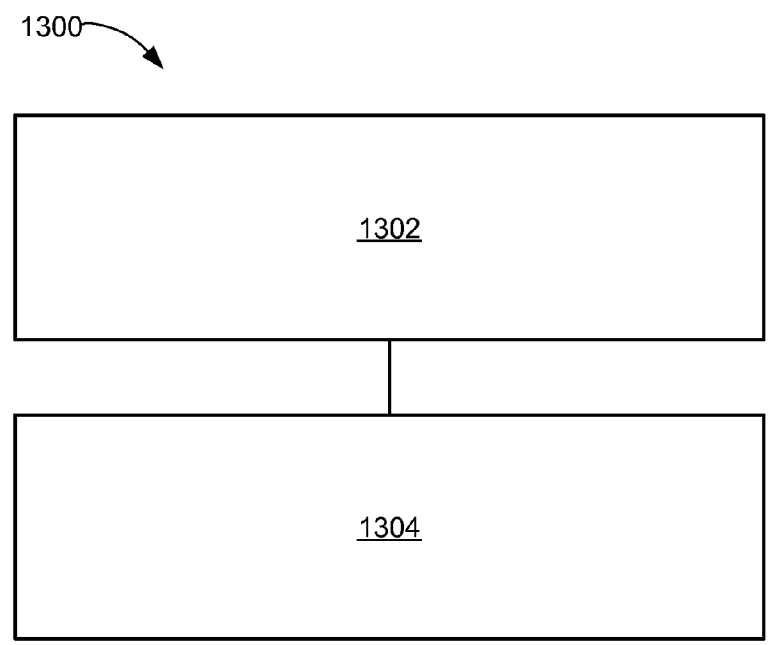
FIG. 13 is a flow chart of a mock bump system, for manufacturing the mock bump system for flip chip integrated circuits in an embodiment of the present invention.

Referring now to FIG. 13, therein is shown a flow chart of a mock bump system 1300 for manufacturing the mock bump system 1000 for flip chip integrated circuits in an embodiment of the present invention. The system 1300 includes providing a first structure having an edge in a block 1302; and forming a mock bump near the edge in a block 1304.

It has been discovered that the present invention thus has numerous aspects.

An aspect that has been discovered is that in the present invention the mushroom shape of the mock bump does not melt during the reflow or soldering process and may solve the delamination problem.

Another aspect is any number of arrays of the contact pads may be supported on the flip chip substrate if each is surrounded by columns of the mock bumps.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the mock bump system for flip chip integrated circuits of the present invention furnishes important and heretofore unknown and unavailable solutions, capabilities, and functional aspects for preventing delamination in flip chip integrated circuit packages. The resulting processes and configurations are straightforward, cost-effective, uncomplicated, highly versatile and effective, can be surprisingly and unobviously implemented by adapting known technologies, and are thus readily suited for efficiently and economically manufacturing flip chip integrated circuit devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a mock bump system comprising:
    providing a first structure, having a solder resist layer and an edge; and
    forming a mock bump near the edge, the mock bump attached only to the first structure with the mock bump including:
        a bump body attached to the first structure and in contact with the solder resist layer, and
        a bump cap having a flat surface between the bump cap and the bump body with the bump cap wider than the bump body and with a gap between the flat surface of the bump cap and the solder resist layer; and
    attaching a chip interconnect to the first structure.

2. The method as claimed in claim 1 wherein the first structure is a flip chip substrate.

3. The method as claimed in claim 1 further comprising coupling a flip chip integrated circuit to the first structure.

4. The method as claimed in claim 1 further comprising forming columns of a plurality of the mock bump on the first structure wherein the first structure is a flip chip substrate.

5. The method as claimed in claim 1 further comprising forming system contacts on the first structure wherein the first structure is a flip chip substrate.

6. A method of manufacture of a mock bump system comprising:
    providing a first structure, having an edge, a system side, and a component side including a solder resist layer on the component side;
    forming a mock bump near the edge, the mock bump attached only to the first structure, the mock bump including forming a bump body and a bump cap, wherein the bump body is attached to the first structure, and in contact with the solder resist layer, and the bump cap has a flat surface between the bump cap and the bump body with the bump cap wider than the bump body and with a gap between the flat surface of the bump cap and the solder resist layer, and having a mushroom shape, secured to the component side; and
    attaching a chip interconnect to the first structure.

7. The method as claimed in claim 6 wherein the first structure is a flip chip substrate including forming an array of contact pads surrounded by the solder resist layer.

8. The method as claimed in claim 6 further comprising coupling a flip chip integrated circuit to the first structure including coupling under bump metallization on the flip chip integrated circuit to contact pads on the first structure, wherein the first structure is a flip chip substrate.

9. The method as claimed in claim 6 further comprising forming columns of a plurality of the mock bump on the first structure wherein the first structure is a flip chip substrate including surrounding an array of contact pads by the columns.

10. The method as claimed in claim 6 further comprising forming system contacts on the first structure wherein the first structure is a flip chip substrate including coupling system interconnects to the system contacts.

11. A mock bump system comprising:
    a first structure having a solder resist layer and an edge;
    a mock bump near the edge, the mock bump attached only to the first structure with the mock bump including:
        a bump body attached to the first structure and in contact with the solder resist layer, and
        a bump cap having a flat surface between the bump cap and the bump body with the bump cap wider than the bump body and with a gap between the flat surface of the bump cap and the solder resist layer; and
    a chip interconnect on the first structure.

12. The system as claimed in claim 11 wherein the first structure is a flip chip substrate.

13. The system as claimed in claim 11 further comprising a flip chip integrated circuit coupled to the first structure.

14. The system as claimed in claim 11 further comprising columns of a plurality of the mock bump on the first structure wherein the first structure is a flip chip substrate.

15. The system as claimed in claim 11 further comprising system contacts on the first structure wherein the first structure is a flip chip substrate.

16. The system as claimed in claim 11 further comprising:
    a system side and a component side on the first structure; and
    the bump body with the bump cap, having a mushroom shape, secured to the component side.

17. The system as claimed in claims 16 wherein the first structure is a flip chip substrate includes an array of contact pads surrounded by the solder resist layer.

18. The system as claimed in claim 16 further comprising a flip chip integrated circuit coupled to the first structure includes under bump metallization on the flip chip integrated circuit coupled to the contact pads on the first structure, wherein the first structure is a flip chip substrate.

19. The system as claimed in claim 16 further comprising columns of a plurality of the mock bump on the first structure wherein the first structure is a flip chip substrate includes an array of contact pads surrounded by the columns.

20. The system as claimed in claim 16 further comprising system contacts on the first structure, wherein the first structure is a flip chip substrate, includes system interconnects coupled to the system contacts.

* * * * *